(12) United States Patent
Yamamura (10) Patent No.: US 8,890,263 B2
(45) Date of Patent: Nov. 18, 2014

(54) SEMICONDUCTOR DEVICE

(71) Applicant: Kabushiki Kaisha Toshiba, Tokyo (JP)

(72) Inventor: Takuji Yamamura, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/776,948

(22) Filed: Feb. 26, 2013

(65) Prior Publication Data

US 2013/0228789 A1    Sep. 5, 2013

(30) Foreign Application Priority Data

Mar. 2, 2012  (JP) ................................. 2012-046458

(51) Int. Cl.
| | | |
|---|---|---|
| H01L 29/66 | (2006.01) | |
| H01L 29/417 | (2006.01) | |
| H01L 29/772 | (2006.01) | |
| H01L 29/423 | (2006.01) | |
| H01L 29/78 | (2006.01) | |
| H01L 29/40 | (2006.01) | |
| H01L 29/778 | (2006.01) | |
| H01L 29/16 | (2006.01) | |
| H01L 29/20 | (2006.01) | |

(52) U.S. Cl.
CPC ............. *H01L 29/78* (2013.01); *H01L 29/1608* (2013.01); *H01L 29/4175* (2013.01); *H01L 29/772* (2013.01); *H01L 29/20* (2013.01); *H01L 29/42316* (2013.01); *H01L 29/402* (2013.01); *H01L 29/41758* (2013.01); *H01L 29/778* (2013.01); *H01L 29/2003* (2013.01); *H01L 29/7787* (2013.01)
USPC .......................................... 257/409; 257/194

(58) Field of Classification Search
USPC ................ 257/194, 728, E29.246, E29.247, 257/E29.248, E29.252, E21.403, E21.407, 257/E29.19, E31.064, E29.253, E21.086, 257/E29.188, E33.025, E33.028, E33.033, 257/E33.034, E51.004, E51.006, E31.085, 257/E27.06, E27.068, E27.069, E29.169, 257/E29.221, E29.242, E21.051, E21.4, 257/102, 200, 279, 289, 425, 631, E33.024, 257/E33.026; 438/167, 172, 142, 125, 438/FOR. 179, FOR. 198, FOR. 181, 438/FOR. 428
See application file for complete search history.

(56) References Cited

U.S. PATENT DOCUMENTS

| 4,871,687 A | * | 10/1989 | Donzelli | ........................ 438/570 |
| 5,252,848 A | * | 10/1993 | Adler et al. | ................... 257/328 |
| 5,872,369 A | * | 2/1999 | Inokuchi | ......................... 257/66 |
| 6,001,710 A | * | 12/1999 | Francois et al. | ............... 438/454 |
| 7,800,131 B2 | * | 9/2010 | Miyamoto et al. | ............ 257/192 |

(Continued)

FOREIGN PATENT DOCUMENTS

| JP | 11-168099 A | 6/1999 |
| JP | 2006-286952 A | 10/2006 |

(Continued)

OTHER PUBLICATIONS

Y.-F. Wu, B.J. Thibeault, B.P. Keller, S. Keller, S.P. Denbaars, and U.K. Mishra, "3-Watt AlGaN/GaN HEMTs on Sapphire Substrates with Thermal Management by Flip-chip Bonding", 1998, IEEE Conference Publications, pp. 118-119.*

(Continued)

*Primary Examiner* — Colleen A Matthews
*Assistant Examiner* — Christopher Johnson
(74) *Attorney, Agent, or Firm* — Oblon, Spivak, McClelland, Maier & Neustadt, L.L.P.

(57) ABSTRACT

A semiconductor device has a shield plate electrode short-circuited to a source electrode near the drain electrode. The shield plate electrode is connected to the source terminal electrode which has a VIA hole via the first line of air-bridge structure or overlay structure.

3 Claims, 10 Drawing Sheets

(56) References Cited

U.S. PATENT DOCUMENTS

| | | | |
|---|---|---|---|
| 7,863,648 B2* | 1/2011 | Miyamoto et al. | 257/192 |
| 7,915,644 B2* | 3/2011 | Wu et al. | 257/194 |
| 8,004,022 B2* | 8/2011 | Yafune et al. | 257/249 |
| 8,530,936 B2* | 9/2013 | Ishii | 257/192 |
| 2005/0062069 A1* | 3/2005 | Saito et al. | 257/213 |
| 2005/0189559 A1* | 9/2005 | Saito et al. | 257/189 |
| 2005/0274977 A1* | 12/2005 | Saito et al. | 257/192 |
| 2006/0006415 A1 | 1/2006 | Wu et al. | |
| 2006/0102929 A1* | 5/2006 | Okamoto et al. | 257/189 |
| 2008/0067563 A1 | 3/2008 | Kawasaki | |
| 2010/0052014 A1* | 3/2010 | Matsushita | 257/192 |
| 2011/0186858 A1 | 8/2011 | Roberts et al. | |
| 2012/0248433 A1* | 10/2012 | Nakano et al. | 257/43 |

FOREIGN PATENT DOCUMENTS

| | | |
|---|---|---|
| JP | 2007-537593 | 12/2007 |
| JP | 2010-27703 A | 2/2010 |
| JP | 2010278280 A * | 12/2010 |

OTHER PUBLICATIONS

J. B. Boos, M. J. Yang, B. R. Bennett, D. Park, W. Kruppa, and R. Bass, "Low-Voltage, High-Speed AlSbDnAsSb HEMTs", May 16-20, 1999, 11th International Conference on Indium Phosphide and Related Materials: TuB3-7.*

Saptharishi Sriram, Alexander V. Suvorov, Jason H. Henning, Daniel J. Namishia, Helmut Hagleitner, Jeremy K. Fisher, Thomas J. Smith, Terry S. Alcorn, and William T. Pulz, "High-Performance Implanted-Channel SiC MESFETs", IEEE Electron Device Letters, vol. 32, No. 3, Mar. 2011: 243-245.*

K. Asano et al. "Novel High Power AlGaAs/GaAs HFET with a Field-Modulating Plate Operated at 35V Drain Voltage", IEDM Technical Digest, IEEE 1998, pp. 59-62.

Y.F. Wu et al. "30-W/mm GaN HEMTs by Field Plate Optimization", IEEE Electron Device Letters, vol. 25, No. 3, Mar. 2004, pp. 117-119.

Huili Xing et al. "High Breakdown Voltage AlGaN-GaN HEMTs Achieved by Multiple Field Plates", IEEE Electron Device Letters, vol. 25, No. 4, Apr. 2004, pp. 161-163.

U.S. Appl. No. 14/018,775, filed Sep. 5, 2013, Yamamura.

Extended European Search Report issued Jul. 7, 2014, in European Patent Application No. 13156852.9.

Office Action issued on Jan. 28, 2014 in the corresponding Japanese Patent Application No. 2012-046458 (with English Translation).

* cited by examiner

SEMICONDUCTOR DEVICE

CROSS-REFERENCE TO RELATED APPLICATION

This application is based upon and claims the benefit of priority from the prior Japanese Patent Application No. 2012-046458, filed on Mar. 2, 2012, the entire contents of which are incorporated herein by reference.

FIELD

An embodiment of the present invention relate to a semiconductor device.

BACKGROUND

A source field plate is known as an electric field relaxation technique for a field effect transistor (FET). The source field plate is capable of relaxing concentration of electric field near a gate electrode by being arranged between a gate and a drain, and as a result, it improves a withstanding voltage of the FET. In order to realize the electric field relaxation effectively, the source field plate is arranged near the gate electrode, or is arranged overlapping with the gate electrode.

As for an FET which is capable of operating at high frequency, such as a millimeter wave band, when it operates at relatively low frequency, such as a microwave band etc., a high gain is expected. On the other hand, however, suppression of oscillation is difficult because amount of feedback becomes large. Although the source field plate is effective in suppression of oscillation, the source field plate increases a capacitance Cgs between gate and source because the source field plate which is short-circuited to the source is arranged near the gate. As a result, the gain of FET decreases.

DETAILED EMBODIMENT

According to one embodiment, a semiconductor device includes: a substrate; a gate electrode which is arranged on a first surface of the substrate and has a plurality of gate finger electrodes; a source electrode which is arranged on the first surface of the substrate, has a plurality of source finger electrodes, and the source finger electrode is close to the gate electrode; a drain electrode which is arranged on the first surface of the substrate and has a plurality of drain finger electrodes, and the drain finger electrode faces the source finger electrode via the gate finger electrode; a gate terminal electrode which is arranged on the first surface of said substrate and connected to the gate electrode; a source terminal electrode which is arranged on the first surface of the substrate, and is connected to the source electrode; a drain terminal electrode which is arranged on the first surface of said substrate and is connected to the drain electrode; an insulating layer which is arranged so as to cover the gate finger electrode, the substrate between the gate finger electrode and the source finger electrode, the substrate between the gate finger electrode and the drain finger electrode, at least a part of the source finger electrode, and at least a part of the drain finger electrode; [a shield plate electrode which is arranged via the insulating layer on the first surface of the substrate between said gate finger electrode and the drain finger electrode, and said drain electrode, is short-circuited to the source finger electrode, and shields electrically the gate finger electrode and the drain finger electrode from each other; a first line which connects the shield plate electrode and the source terminal electrode.

Next, the embodiment is described with reference to the drawings. Hereinafter, the same numeral is given to the same element and an overlapping explanation is avoided, thereby, the explanation is simplified. The drawings are schematic and you should be care about that they differ from an actual semiconductor device. The drawing contains a portion of an expansion ratio different from the expansion ratio of other portion in the same drawing.

The embodiment shown below illustrates a device and method for materializing a technical idea, and the embodiment does not specify arrangement of each component part etc. as the following. Various modifications may be added to the embodiment within coverage of claims attached herewith.
[Embodiment]
(Semiconductor Device)

Figure 1:
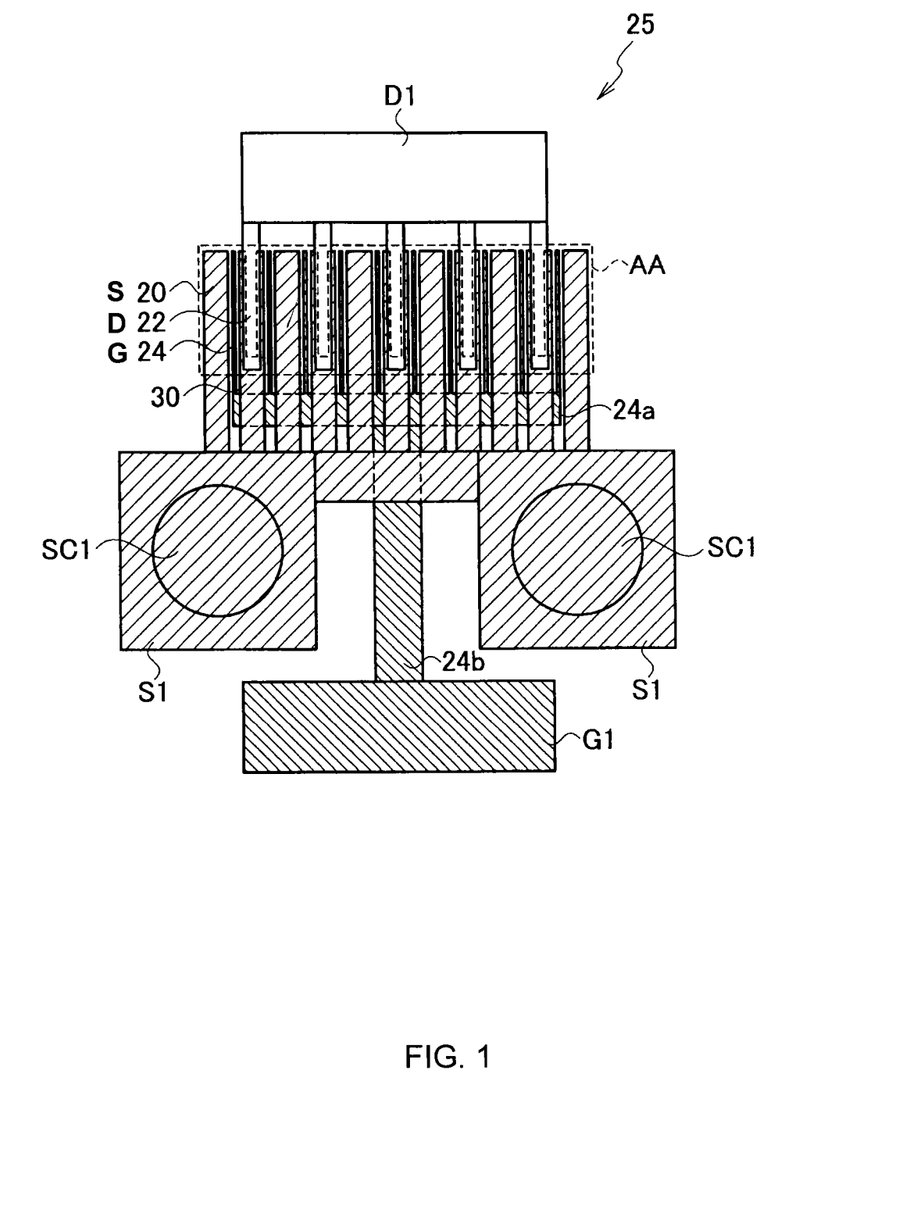
FIG. 1 is a schematic plane pattern structure of a semiconductor device concerning an embodiment.
Figure 2:
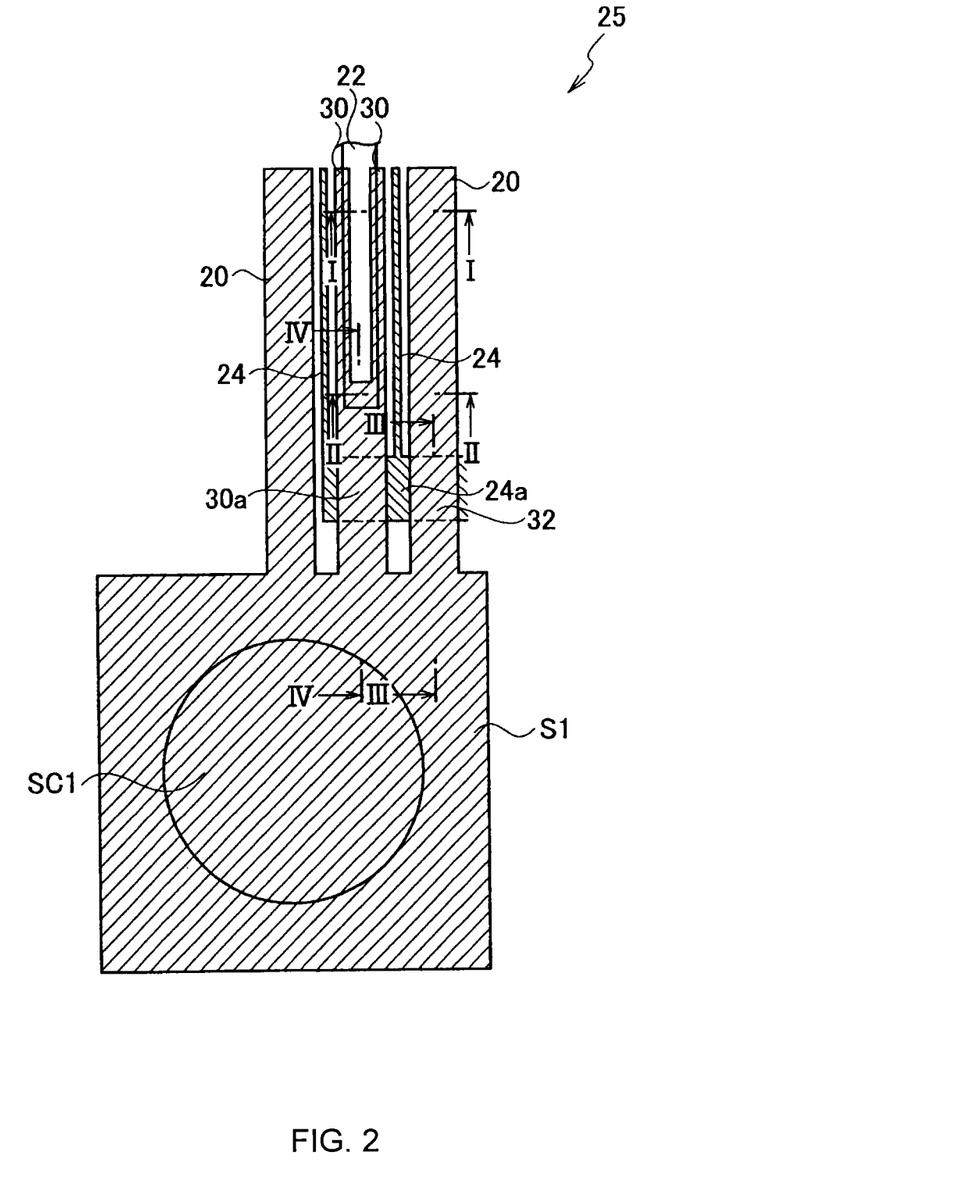
FIG. 2 is a schematic plane pattern structure of a portion which includes two unit transistors of the semiconductor device concerning the embodiment.

FIG. 1 shows a schematic plane pattern structure of a semiconductor device 25 concerning an embodiment. FIG. 2 shows a schematic plane pattern structure of a portion which includes two unit transistors of the semiconductor device 25 concerning the embodiment.

Figure 3:
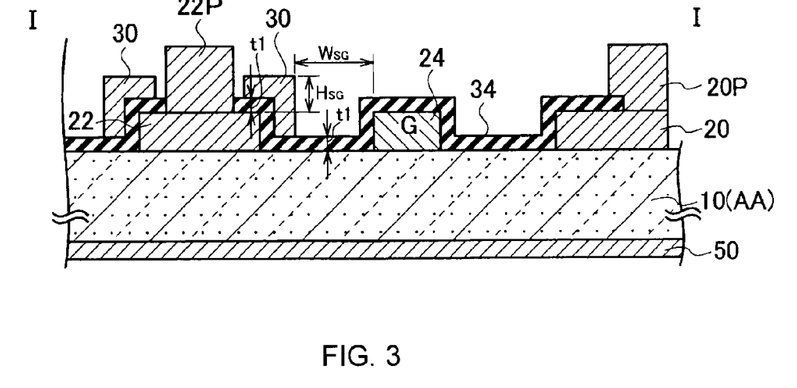
FIG. 3 is a schematic cross section taken along a I-I line of FIG. 2.
Figure 4:
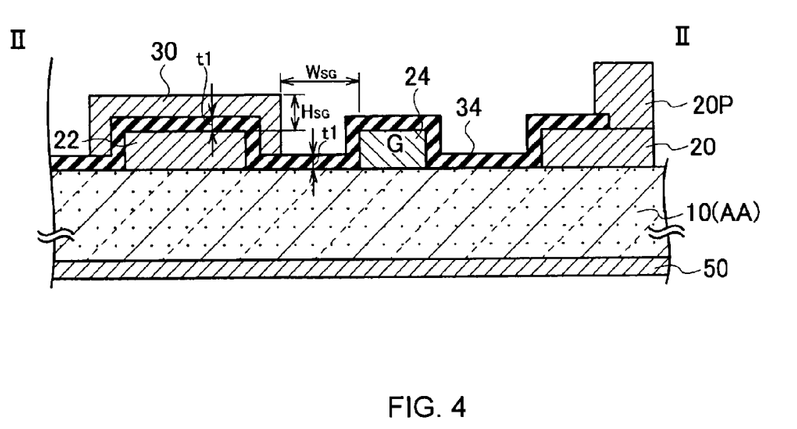
FIG. 4 is a schematic cross section taken along a II-II line of FIG. 2.
Figure 5:
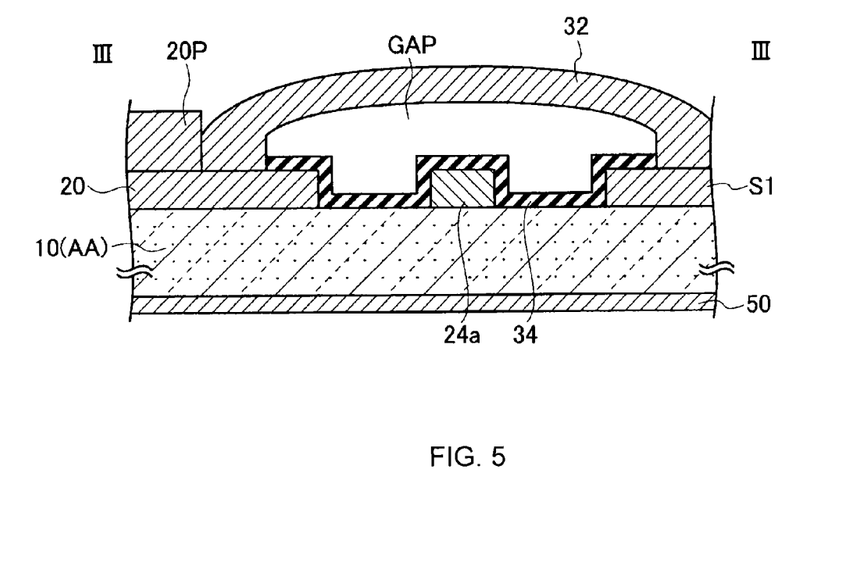
FIG. 5 is a schematic cross section taken along a III-III line of FIG. 2.
Figure 6:
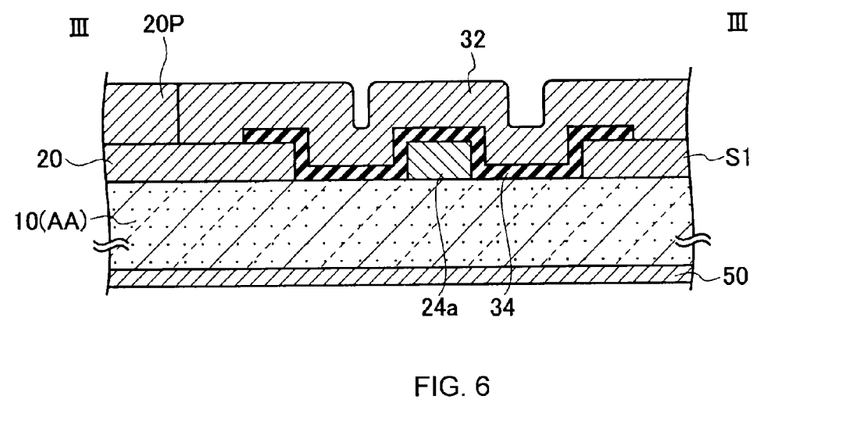
FIG. 6 is another schematic cross section taken along the III-III line of FIG. 2.
Figure 7:
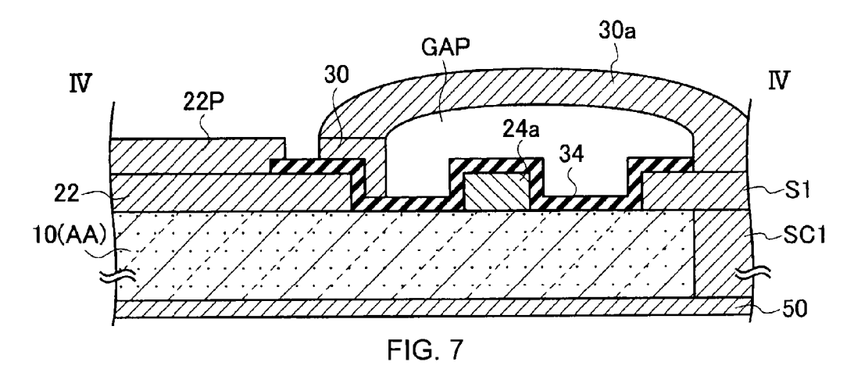
FIG. 7 is a schematic cross section taken along a IV-IV line of FIG. 2.
Figure 8:
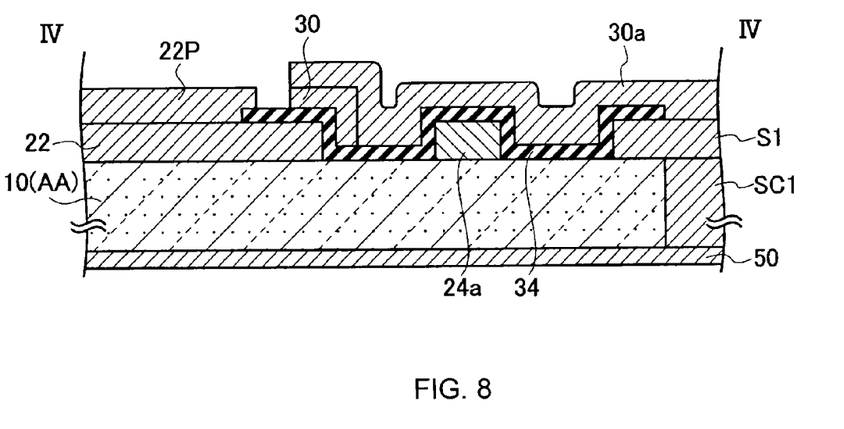
FIG. 8 is another schematic cross section taken along the IV-IV line of FIG. 2.

FIG. 3 shows a schematic cross section taken along a I-I line of FIG. 2, and FIG. 4 shows a schematic cross section taken along a II-II line of FIG. 2. FIG. 5 shows a schematic cross section taken along a III-III line of FIG. 2. FIG. 6 shows another schematic cross section taken along the III-III line of FIG. 2. FIG. 7 shows a schematic cross section taken along a IV-IV line of FIG. 2. In addition, FIG. 8 shows another schematic cross section taken along the IV-IV line of FIG. 2.

The semiconductor device 25 concerning the embodiment is provided with a substrate 10, a gate electrode G, a source electrode S, a drain electrode D, an insulating layer 34, a shield plate electrode 30, and a first line 30a as shown in FIG. 1-FIG. 3.

The gate electrode G is arranged on a first surface of the substrate 10 and has a plurality of gate finger electrodes 24. The source electrode S is arranged on the first surface of the substrate 10 and has a plurality of source finger electrodes 20. The source finger electrode 20 is close to the gate finger electrode 24. The drain electrode 22 is arranged on the first surface of the substrate 10 and has a plurality of drain finger electrodes 22. The drain finger electrode 22 faces the source finger electrode 20 via the gate finger electrode 24. In the following explanation, the gate finger electrode 24 may be simply called a gate electrode 24, the source finger electrode 20 may be simply called a source electrode 20, and the drain finger electrode 22 may be simply called a drain electrode 22.

As shown in FIG. 3, the insulating layer 34 is arranged so that the gate electrode 24, the substrate 10 between the gate electrode 24 and the source electrode 20, the substrate 10 between the gate electrode 24 and the drain electrode 22, at least a part of the source electrode 20, and at least a part of the drain electrode 22 may be covered by the insulating layer 34.

As shown in FIG. 3, the shield plate electrode 30 is arranged via the insulating layer 34 over the first surface of the substrate 10 between the gate electrode 24 and the drain electrode 22 and over the drain electrode 22. The shield plate electrode 30 is short-circuited to the source electrode 20, and shields electrically the gate electrode 24 and the drain electrode 22 from each other.

The first line 30a connects the shield plate electrode 30 and the source terminal electrode S1 by air-bridge structure having an air gap GAP, as shown in FIG. 7.

The first line 30a may connect the shield plate electrode 30 and the source terminal electrode S1 by an overlay structure via the insulating layer 34, as shown in FIG. 8. Furthermore, the semiconductor device 25 concerning the embodiment is provided with a second line 32 which connects the source electrode 20 and the source terminal electrode 51 by air-bridge structure or an overlay structure as shown in FIG. 5-FIG. 6. Accordingly, a plurality of the source finger electrodes 20 are connected to the source terminal electrode S1.

Furthermore, the semiconductor device 25 concerning the embodiment is provided with gate bus lines 24a and 24b which connect the gate electrode 24 and the gate terminal electrode G1 as shown in FIG. 1 and FIG. 2. The first line 30a is arranged over the gate bus line 24a, as shown in FIG. 7 and FIG. 8. And, the second line 32 is arranged over the gate bus line 24a, as shown in FIG. 5 and FIG. 6. Accordingly, a plurality of the gate finger electrodes 24 are connected to the gate terminal electrode G1.

A plurality of the drain finger electrodes 22 are connected to a drain terminal electrode G1.

In addition, the shield plate electrode 30 is separated from the gate electrode 24 by at least only a distance WSG longer than a thickness t1 of the insulating layer, as shown in FIG. 3. By constituting thus, effect of electric shield between the drain and the gate is increased, a capacitance Cgd between the gate and the drain is reduced. Since the shield plate electrode 30 is separated from the gate electrode 24, an increase in a capacitance Cgs between the gate and the source can be suppressed. Here, the shield plate electrode 30 should just be separated from the gate electrode 24 by at least only the distance WSG longer than the thickness t1 of the insulating layer. Here, what is necessary is just WSG>0.

Furthermore, the shield plate electrode 30 covers at least a part of upper part of the drain electrode 22 via the insulating layer 34, as shown in FIG. 3 and FIG. 4.

As for the effect of electric shield between the gate and the drain by the shield plate electrode 30, the thinner the thickness t1 of the insulating layer 34 is, the greater the effect is. In the case where the thickness t1 of the insulating layer 34 is relatively thick, the number of lines of electric force which run the inside of the insulating layer 34 between the gate electrode 24 and the drain electrode 22 increases, and the effect of electric shield between the gate electrode 24 and the drain electrode 22 is reduced. On the other hand, in the case where the thickness t1 of the insulating layer 34 is relatively thin, the number of the lines of electric force which run the inside of the insulating layer 34 between the gate electrode 24 and the drain electrode 22 decreases correspondingly to a thinned part of the insulating layer 34, and the effect of electric shield between the gate electrode 24 and the drain electrode 22 increases.

As shown in FIG. 3, a drain pad electrode 22P may be arranged on the drain electrode 22, and a source pad electrode 20P may be arranged on the source electrode 20. Resistance ingredients of the drain electrode D and the source electrode S which have finger structure, respectively can be reduced by the drain pad electrode 22P and the source pad electrode 20P.

In addition, as shown in FIG. 3 and FIG. 4, in the semiconductor device 25 concerning the embodiment, an upper end of the shield plate electrode 30 measured from the first surface of the substrate 10 is higher than an upper end of the gate electrode 24 by only a height HSG. By constituting thus, the effect of electric shield between the drain and the gate can be increased.

In the semiconductor device 25 concerning the embodiment, by arranging the shield plate electrode 30 which is short-circuited to the source terminal electrode near the drain electrode, the drain and the gate are electrically shielded from each other, the capacitance Cgd between the gate and the drain is reduced, and the increase in the capacitance Cgs between the gate and the source can be suppressed. Accordingly, concentration of the electric field between the gate and the drain can be relaxed without degrading a high-frequency characteristic.

In addition, in the semiconductor device 25 concerning the embodiment, the capacitance Cgd between the gate and the drain can be reduced. As a result, S parameter S12 can be reduced and a semiconductor device of high gain can be obtained.

FIG. 1 shows an FET cell in the semiconductor device 25 concerning the embodiment. The semiconductor device 25 includes: the semi-insulating substrate 10; the gate electrode G which is arranged on the first surface of the semi-insulating substrate 10 and has a plurality of the gate finger electrodes 24; the source electrode S which is arranged on the first surface of the semi-insulating substrate 10 and has a plurality of the source finger electrodes 20; the drain electrode D which is arranged on the first surface of the semi-insulating substrate 10 and has a plurality of the finger electrodes 22; the gate terminal electrode G1 which is arranged on the first surface of the semi-insulating substrate 10 and is connected to the gate electrode 24; the source terminal electrode S1 which is arranged on the first surface of the semi-insulating substrate 10, and is connected to the source electrode 20; the drain terminal electrode D1 which is arranged on the first surface of the semi-insulating substrate 10, and is connected to the drain electrode 22; a VIA hole SC1 which is arranged under the source terminal electrode S1; and a ground electrode 50 (see FIG. 5, for example) which is arranged on a second surface opposite to the first surface of the semi-insulating substrate 10 and is connected to the source terminal electrode S1 via the VIA the hole SC1.

In the FET cell, a plurality of the gate finger electrodes 24 are connected to the gate bus line 24a, and the gate bus line 24a is connected to the gate terminal electrode G1 via the gate bus line 24b.

The VIA hole SC1 is formed in the semi-insulating substrate 10 and includes a barrier metal layer (not shown) formed on an inner wall of a hole and a filling metal layer (not shown) which is formed on the barrier metal layer and with which the hole is filled up. The source terminal electrode S1 is connected to the ground electrode 50 via the barrier metal layer and the filling metal layer of the VIA hole SC1.

The semi-insulating substrate 10 is any one of a GaAs substrate, an SiC substrate, a GaN substrate, a substrate including the SiC substrate on which a GaN epitaxial layer is formed, a substrate including the SiC substrate on which a hetero-junction epitaxial layer which consists of GaN/AlGaN is formed, a sapphire substrate, and a diamond substrate.

Furthermore, in the semiconductor device 25 concerning the embodiment, the semiconductor device is provided with a GaAs system HEMT, a GaAs MESFET or a GaN system HEMT. That is, in the semiconductor device 25 concerning the embodiment, a semiconductor material suitable for high-frequency operations, such as GaN and GaAs, is used especially for a semiconductor device.

(Construction of FET Cell)
(Constructional Example 1)

Figure 9:
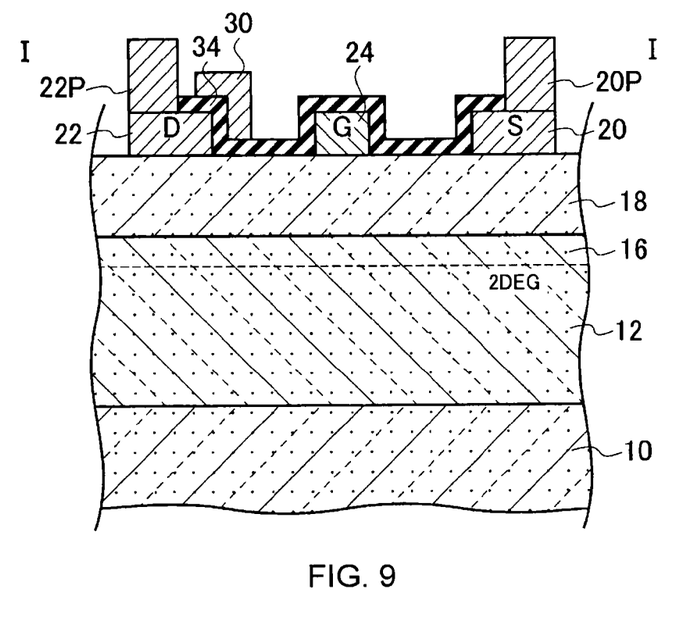
FIG. 9 is a schematic cross section taken along the I-I line of FIG. 2.

FIG. 9 shows a constructional example 1 of an FET cell by a schematic cross section taken along the I-I line of FIG. 2. The FET cell includes: a substrate 10; an epitaxial layer 12 which is arranged on the substrate 10; an electron supplying layer 18 which is arranged on the epitaxial layer 12; a source electrode 20, a gate electrode 24, and a drain electrode 22 which are arranged on the electron supplying layer 18; an insulating layer 34 which is arranged so as to cover the gate electrode 24, the electron supplying layer 18 between the gate electrode 24 and the source electrode 20, the electron supplying layer 18 between the gate electrode 24 and the drain electrode 22, at least a part of the source electrode 20, and at least a part of the drain electrode 22; and a shield plate electrode 30 which is arranged via the insulating layer 34 over the drain electrode 22 and the electron supplying layer 18 between the gate electrode 24 and the drain electrode 22, is short-circuited to a source terminal electrode S1, and shields electrically the gate electrode 24 and the drain electrode 22 from each other.

The shield plate electrode 30 is connected to the source terminal electrode S1 via a first line 30a of air-bridge structure or overlay structure.

A two-dimensional electron gas (2 DEG) layer 16 is formed in an interface of the epitaxial layer 12 and the electronic supplying layer 18. A high-electron mobility transistor (HEMT) is shown in FIG. 9.

As a specific material, in the case of a GaAs system HEMT, the substrate 10 is formed by a GaAs substrate, the epitaxial layer 12 is formed by a GaAs layer, and the electron supplying layer 18 is formed by an aluminum gallium arsenide layer ($Al_yGa_{1-y}As$) ($0.1 \leq y \leq 1$), for example. In the case of a GaN system HEMT, the substrate 10 is formed by a GaN substrate or the SiC substrate, the epitaxial layer 12 is formed by a GaN layer, and the electron supplying layer 18 is formed by the aluminum gallium nitride layer ($Al_xGa_{1-x}N$) ($0.1 \leq x \leq 1$), for example. In the constructional example 1 shown in FIG. 9, the substrate 10, the epitaxial layer 12 and the electron supplying layer 18 correspond to the substrate 10 in FIG. 3 as a whole.

(Constructional Example 2)

Figure 10:
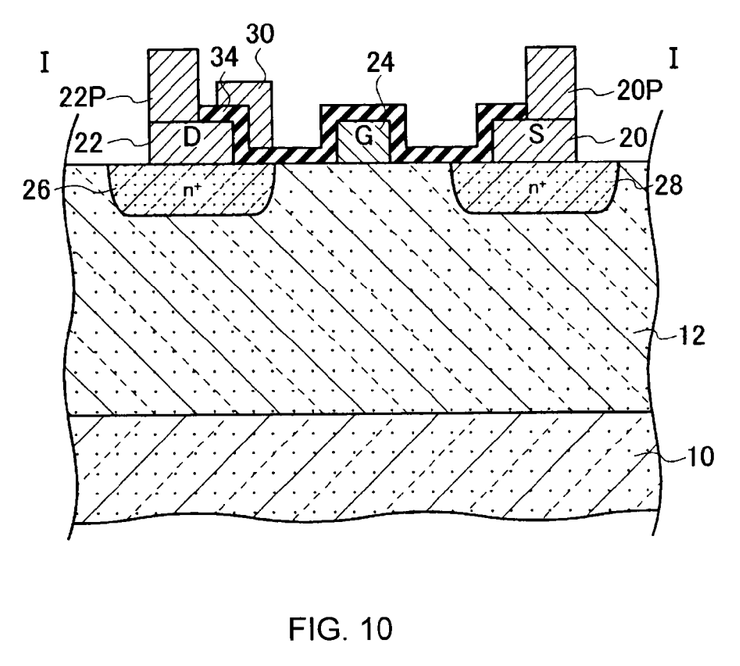
FIG. 10 is a schematic cross section taken along the I-I line of FIG. 2.

FIG. 10 shows a constructional example 2 of an FET cell by a schematic cross section taken along the I-I line of FIG. 2. The FET cell includes: a substrate 10; an epitaxial layer 12 which is arranged on the substrate 10; a source region 28 and a drain region 26 which are arranged in the epitaxial layer 12; a source electrode 20 which is arranged on the source region 28; a gate electrode 24 which is arranged on the epitaxial layer 12; a drain electrode 22 which is arranged on the drain region 26; an insulating layer 34 which is arranged so as to cover the gate electrode 24, the epitaxial layer 12 between the gate electrode 24 and the source electrode 20, the epitaxial layer 12 between the gate electrode 24 and the drain electrode 22, at least a part of the source electrode 20, and at least a part of the drain electrode 22; and a shield plate electrode 30 which is arranged via the insulating layer 34 over the drain electrode 22 and the epitaxial layer 12 between the gate electrode 24 and the drain electrode 22, is short-circuited to the source terminal electrode S1, and shields electrically the gate electrode 24 and the drain electrode 22 from each other.

The shield plate electrode 30 is connected to a source terminal electrode S1 via a first line 30a of air-bridge structure or overlay structure.

A Schottky contact is formed in an interface of the epitaxial layer 12 and the gate electrode 24. A metal-semiconductor field effect transistor (MESFET) is shown in FIG. 10. For example, in the case of a GaAs MESFET, the substrate 10 is formed by a GaAs substrate, and the epitaxial layer 12 is formed by an epitaxially grown GaAs layer. The source region 28 and the drain region 26 can be formed by ion implantation, such as Si ion etc. In the constructional example 2 shown in FIG. 10, the substrate 10 and the epitaxial layer 12 correspond to the substrate 10 in FIG. 4 as a whole.

(Constructional Example 3)

Figure 11:
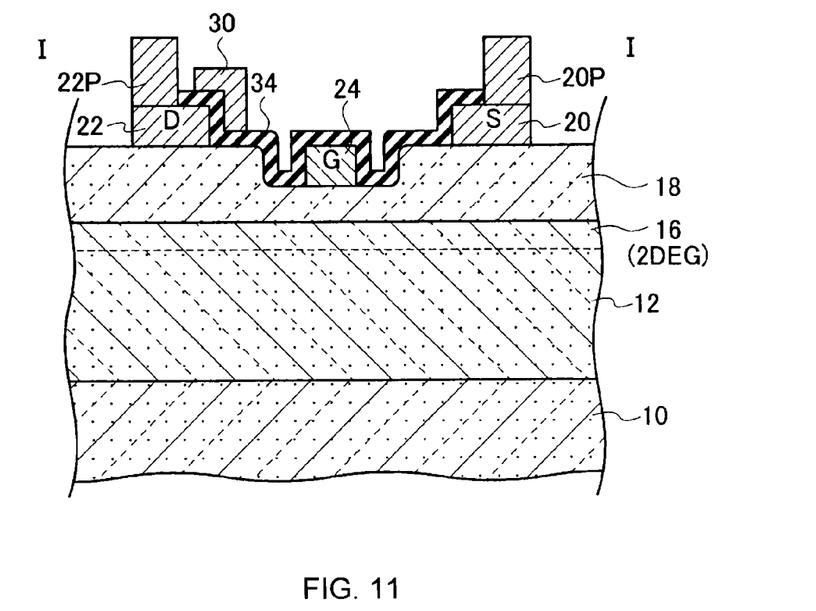
FIG. 11 is a schematic cross section taken along the I-I line of FIG. 2.

FIG. 11 shows a constructional example 3 of an FET cell by a schematic cross section taken along the I-I line of FIG. 2. The FET cell includes: a substrate 10; an epitaxial layer 12 which is arranged on the substrate 10; an electron supplying layer 18 which is arranged on the epitaxial layer 12; a source electrode 20 and a drain electrode 22 which are arranged on the electron supplying layer 18; a gate electrode 24 which is arranged on a recess part of the electron supplying layer 18; an insulating layer 34 which is arranged so as to cover the gate electrode 24, the electron supplying layer 18 between the gate electrode 24 and the source electrode 20, the electron supplying layer 18 between the gate electrode 24 and the drain electrode 22, at least a part of the source electrode 20, and at least a part of the drain electrode 22; and a shield plate electrode 30 which is arranged via the insulating layer 34 over the drain electrode 22 and the electron supplying layer 18 between the gate electrode 24 and the drain electrode 22, is short-circuited to the source terminal electrode S1, and shields electrically the gate electrode 24 and the drain electrode 22 from each other.

The shield plate electrode 30 is connected to a source terminal electrode S1 via a first line 30a of air-bridge structure or overlay structure.

A 2 DEG layer 16 is formed in an interface of the epitaxial layer 12 and the electron supplying layer 18. An HEMT is shown in FIG. 11.

As a specific material, in the case of a GaAs system HEMT, the substrate 10 is formed by a GaAs substrate, the epitaxial layer 12 is formed by a GaAs layer, and the electron supplying layer 18 is formed by the aluminum gallium arsenide layer (Al$_y$Ga$_{1-y}$As) (0.1≤y≤1), for example. In addition, in the case of a GaAs system HEMT, an activity layer may be formed by ion implantation of Si ion etc. in the electron supplying layer 18 directly under the gate electrode 24.

In the case of a GaN system HEMT, the substrate 10 is formed by a GaN substrate or an SiC substrate, the epitaxial layer 12 is formed by a GaN layer, and the electron supplying layer 18 is formed by the aluminum gallium nitride layer (Al$_x$Ga$_{1-x}$N) (0.1≤x≤1), for example. In the constructional example 3 shown in FIG. 11, the substrate 10 and the epitaxial layer 12 correspond to the substrate 10 in FIG. 4 as a whole.

(Constructional Example 4)

Figure 12:
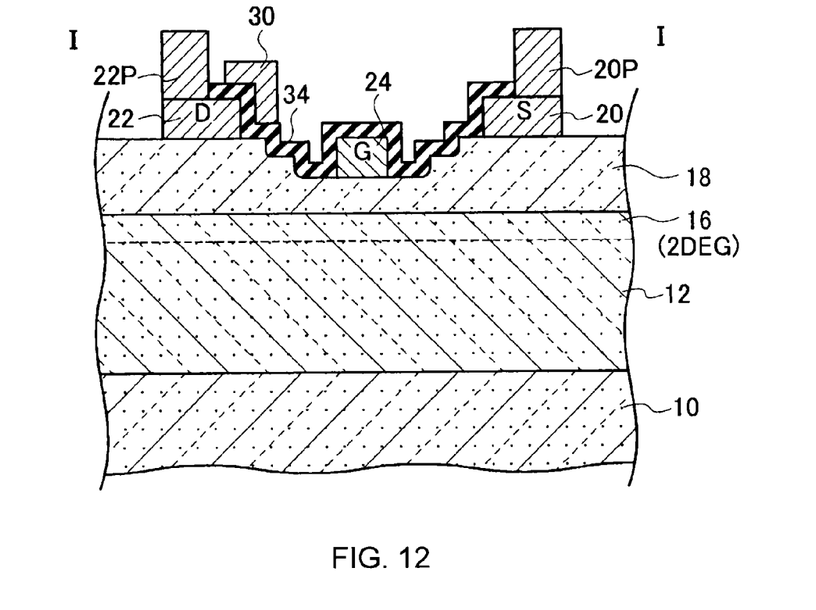
FIG. 12 is a schematic cross section taken along the I-I line of FIG. 2.

FIG. 12 shows a constructional example 4 of an FET cell by a schematic cross section taken along the I-I line of FIG. 2. The FET cell includes: a substrate 10; an epitaxial layer 12 which is arranged on the substrate 10; an electron supplying layer 18 which is arranged on the epitaxial layer 12; a source electrode 20 and a drain electrode 22 which are arranged on the electron supplying layer 18; a gate electrode 24 which is arranged on the two-step recess part of the electron supplying layer 18; an insulating layer 34 which is arranged so as to cover the gate electrode 24, the electron supplying layer 18 between the gate electrode 24 and the source electrode 20, the electron supplying layer 18 between the gate electrode 24 and the drain electrode 22, at least a part of the source electrode 20, and at least a part of the drain electrode 22; and a shield plate electrode 30 which is arranged via the insulating layer 34 over the drain electrode 22 and the electron supplying layer 18 between the gate electrode 24 and the drain electrode 22, is short-circuited to a source terminal electrode S1, and shields electrically the gate electrode 24 and the drain electrode 22 from each other.

The shield plate electrode 30 is connected to a source terminal electrode S1 via a first line 30a of air-bridge structure or overlay structure.

A 2 DEG layer 16 is formed in an interface of the epitaxial layer 12 and the electron supplying layer 18. An HEMT is shown in FIG. 12.

As a specific material, in the case of a GaAs system HEMT, the substrate 10 is formed by a GaAs substrate, the epitaxial layer 12 is formed by a GaAs layer, and the electron supplying layer 18 is formed by the aluminum gallium arsenide layer (Al$_y$Ga$_{1-y}$As) (0.1≤y≤1), for example. In addition, in the case of a GaAs system HEMT, an activity layer may be formed by ion implantation of Si ion etc. in the electron supplying layer 18 directly under the gate electrode 24.

In the case of a GaN system HEMT, the substrate 10 is formed by a GaN substrate or an SiC substrate, the epitaxial layer 12 is formed by a GaN layer, and the electron supplying layer 18 is formed by the aluminum gallium nitride layer (Al$_x$Ga$_{1-x}$N) (0.1≤x≤1), for example. In the constructional example 4 shown in FIG. 12 the substrate 10 and the epitaxial layer 12 correspond to the substrate 10 in FIG. 4 as a whole.

In addition, in the semiconductor device 25 concerning the embodiment, as for the gate electrode 24, a cross section shape of the gate electrode 24 in a cross section in a direction of a channel between the source and the drain may be formed in T type so that the electric field in the circumference of the gate electrode 24 may be relaxed.

(Modification 1)

Figure 13:
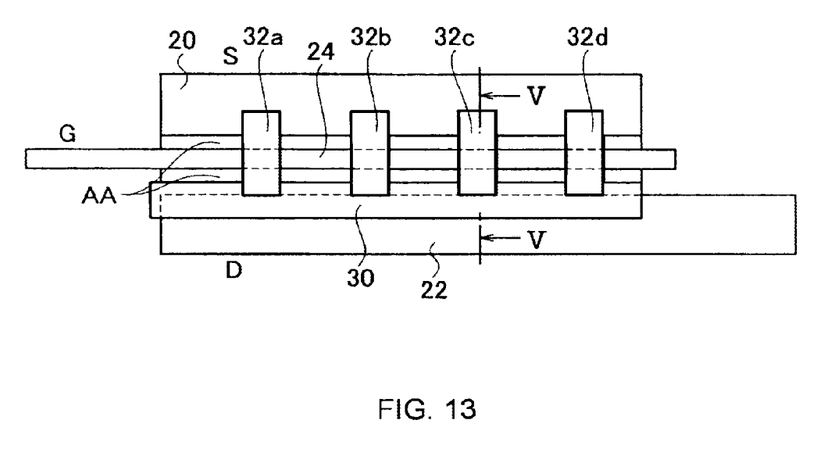
FIG. 13 is a schematic plane pattern structure of the semiconductor device concerning a modification 1 of the embodiment.
Figure 14:
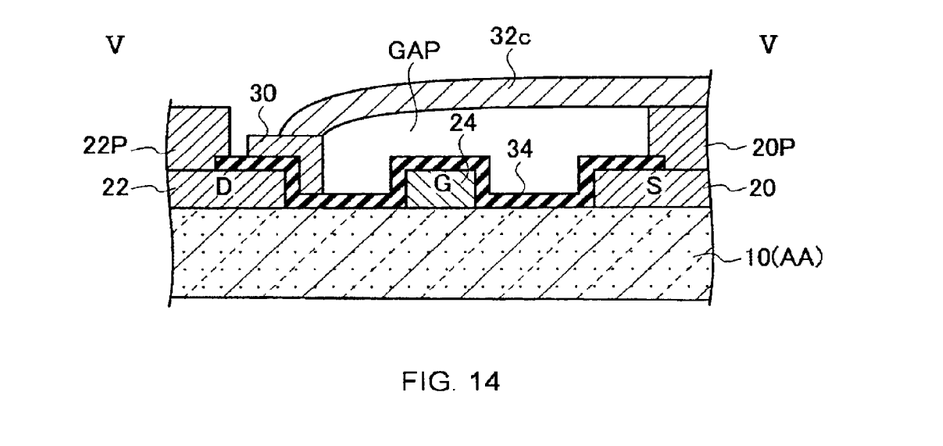
FIG. 14 is a schematic cross section taken along a V-V line of FIG. 13.
Figure 15:
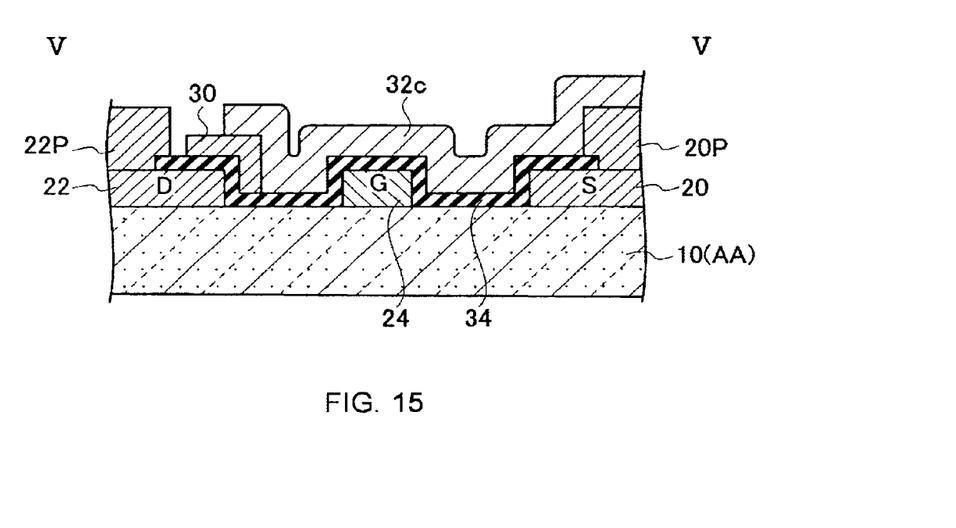
FIG. 15 is another schematic cross section taken along the V-V line of FIG. 13.

FIG. 13 shows a schematic plane pattern structure of a high-frequency semiconductor device concerning a modification 1 of the embodiment. FIG. 14 shows a schematic cross section taken along the V-V line of FIG. 13, and FIG. 15 shows another schematic cross section taken along the V-V line of FIG. 13.

In the semiconductor device concerning the modification 1 of the embodiment, shield plate short circuit lines 32a, 32b, 32c and 32d overlap with the gate electrode 24.

In the example of FIG. 14, each of the shield plate short circuit lines 32a, 32b, 32c and 32d is arranged via air gap GAP over the gate electrode 24. And, in the example of FIG. 15, each of the shield plate short circuit lines 32a, 32b, 32c and 32d is arranged via the insulating layer 34 over the gate electrode 24. Other composition is the same as that of the embodiment.

In the semiconductor device concerning the modification 1 of the embodiment, since the shield plate short circuit lines 32a, 32b, 32c and 32d overlap with the gate electrode 24 via the air gap GAP or the insulating layer 34, lines which short-circuit the source electrode 20 and the shield plate electrode 30 can be shortened.

For this reason, inductance of a parasitic inductor connected to a source of the FET cell can be reduced, and feedback impedance of each FET cell can be reduced.

In the semiconductor device concerning the modification 1 of the embodiment, a drain and a gate are shielded electrically from each other, a capacitance Cgd between the gate and the drain is reduced, an increase in a capacitance Cgs between the gate and a source can be suppressed. Accordingly, concentration of electric field between the gate and the drain can be relaxed without degrading a high-frequency characteristic.

In addition, the capacitance Cgd between the gate and the drain can be reduced in the semiconductor device 25 concerning the modification 1 of the embodiment. For this reason, S parameter S12 can be reduced and a semiconductor device of high gain can be obtained.

(Modification 2)

A schematic plane pattern structure of the semiconductor device 25 concerning a modification 2 of the embodiment is similarly expressed as FIG. 1. In the semiconductor device 25 concerning the modification 2 of the embodiment, a schematic plane pattern structure of a portion of two unit transistors is similarly expressed as FIG. 2.

Figure 16:
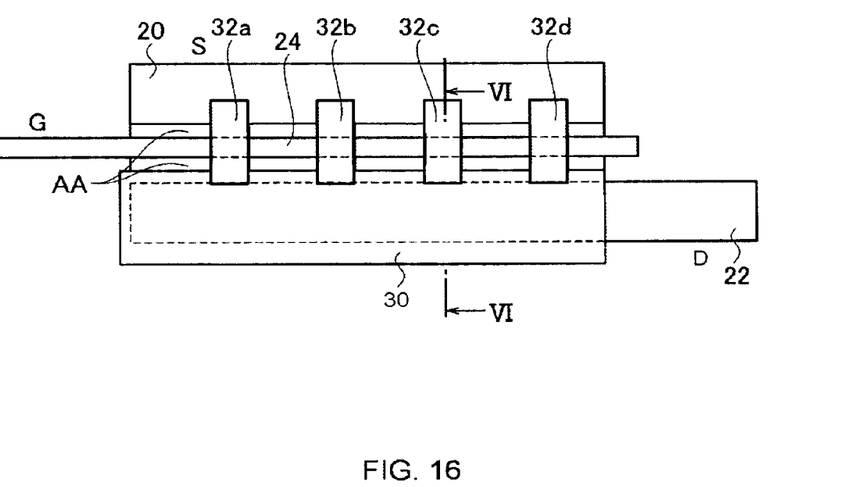
FIG. 16 is a schematic plane pattern structure of the semiconductor device concerning a modification 2 of the embodiment.
Figure 17:
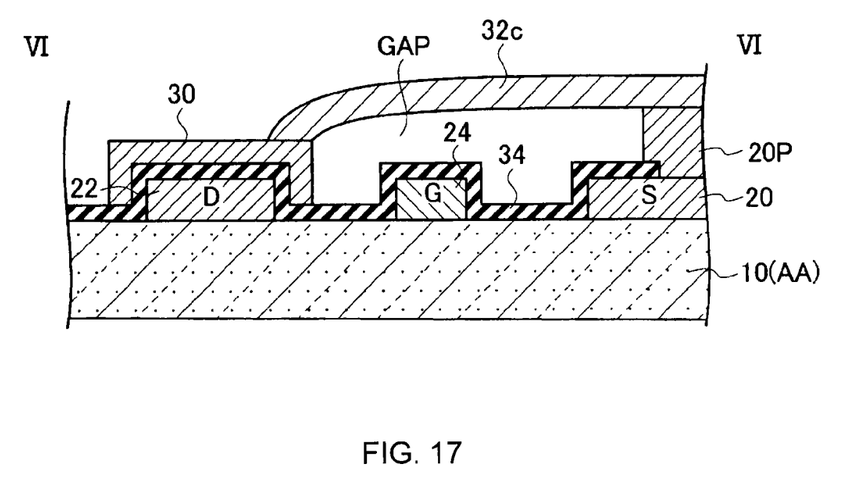
FIG. 17 is a schematic cross section taken along a VI-VI line of FIG. 16.
Figure 18:
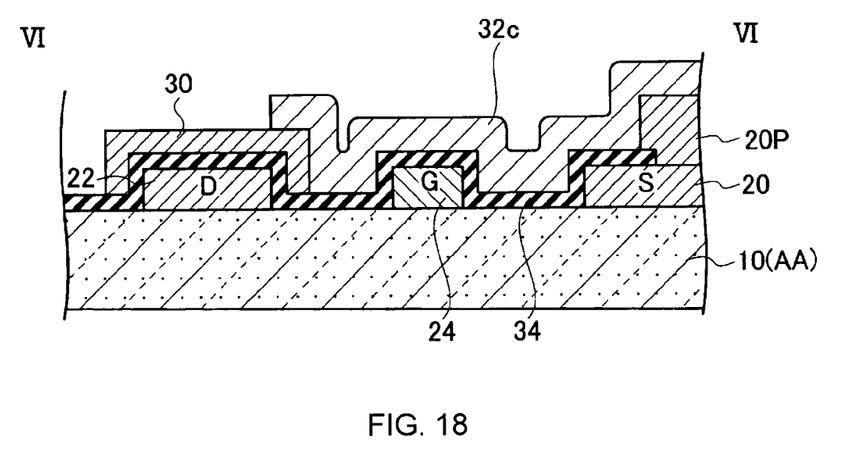
FIG. 18 is another schematic cross section taken along the VI-VI line of FIG. 16.

FIG. 16 shows a schematic plane pattern structure of the semiconductor device 25 concerning the modification 2 of the embodiment. FIG. 17 shows a schematic cross section taken along a VI-VI line of FIG. 16, and FIG. 18 shows another schematic cross section taken along the VI-VI line of FIG. 16.

In the semiconductor device concerning the modification 2 of the embodiment, shield plate short circuit lines 32a, 32b, 32c and 32d overlap with a gate electrode 24.

In the example of FIG. 17, the shield plate short circuit lines 32a, 32b, 32c and 32d are arranged via air gap GAP over the gate electrode 24. In the example of FIG. 18, the shield plate short circuit lines 32a, 32b, 32c and 32d are arranged via an insulating layer 34 over the gate electrode 24.

As shown in FIG. 16, a shield plate electrode 30 is arranged via the insulating layer 34 over a drain electrode 22, is short-circuited to a source terminal electrode S1 and a source electrode 20, and shields electrically the gate electrode 24 and a drain electrode 22 from each other. In the semiconductor device 25 concerning the modification 2 of the embodiment, as shown in FIG. 16 to FIG. 18, the shield plate electrode 30 is arranged via the insulating layer 34 over the drain electrode 22. For this reason, compared with the embodiment and its modification 1, effect of electric shield between the gate electrode 24 and the drain electrode 22 is increased.

In the semiconductor device concerning the modification 2 of the embodiment, since the shield plate short circuit lines 32a, 32b, 32c and 32d overlap with gate electrode 24 via the air gap GAP or the insulating layer 34, lines which short-circuit the source electrode 20 and the shield plate electrode 30 can be shortened.

For this reason, inductance of a parasitic inductor connected to the source of the FET cell can be reduced, and feedback impedance of each FET cell can be reduced.

In the semiconductor device concerning the modification 2 of the embodiment, the drain and the gate are shielded electrically from each other, a capacitance Cgd between the gate and the drain is reduced, an increase in a capacitance Cgs between the gate and the source can be suppressed. Accordingly, concentration of electric field between the gate and the drain can be relaxed without degrading a high-frequency characteristic.

In addition, the capacitance Cgd between the gate and the drain can be reduced in the semiconductor device 25 concerning the modification 2 of the embodiment. Therefore, S parameter S12 can be reduced and a semiconductor device of high gain can be obtained.

Since other composition is the same as that of the embodiment, an overlapping explanation is omitted.

As explained above, according to this embodiment, a semiconductor device of high gain can be provided.

[Other Embodiments]

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

As a semiconductor chip carried in the semiconductor device concerning the embodiment, not only an FET and an HEMT but an amplification element, such as an LDMOS (Laterally Diffused Metal Oxide Semiconductor Field Effect Transistor), an HBT (Hetero-junction Bipolar Transistor), etc.

What is claimed is:

1. A semiconductor device, comprising:
    a substrate;
    a gate electrode, which is arranged on a first surface of the substrate and has a plurality of gate finger electrodes;
    a source electrode, which is arranged on the first surface of the substrate and has a plurality of source finger electrodes, and one of the plurality of source finger electrodes is close to one of the plurality of gate finger electrodes;
    a drain electrode, which is arranged on the first surface of the substrate and has a plurality of drain finger electrodes, and one of the plurality of drain finger electrodes faces the one of the plurality of source finger electrodes via the one of the plurality of gate finger electrodes;
    a gate terminal electrode, which is arranged on the first surface of the substrate and is connected to the gate electrode;
    a source terminal electrode, which is arranged on the first surface of the substrate and is connected to the source electrode;
    a drain terminal electrode, which is arranged on the first surface of the substrate and is connected to the drain electrode;
    an insulating layer, which is arranged so as to cover the one of the plurality of gate finger electrodes, the substrate between the one of the plurality of gate finger electrodes and the one of the plurality of source finger electrodes, the substrate between the one of the plurality of gate finger electrodes and the one of the plurality of drain finger electrodes, at least a part of the one of the plurality of source finger electrodes, and at least a part of the one of the plurality of drain finger electrodes;
    a shield plate electrode, which is arranged via the insulating layer over the one of the plurality of drain finger electrodes and the first surface of the substrate between the one of the plurality of gate finger electrodes and the one of the plurality of drain finger electrodes, is short-circuited to the one of the plurality of source finger electrodes, and shields electrically the one of the plurality of gate finger electrodes and the one of the plurality of drain finger electrodes from each other;
    a first line, which connects the shield plate electrode and the source terminal electrode by an air-bridge structure or an overlay structure; and
    a shield plate short circuit line, which short-circuits the shield plate electrode and the one of the plurality of source finger electrodes;
    wherein the shield plate short circuit line overlaps with the one of the pluralityof gate finger electrodes, and
    wherein the shield plate short circuit line is arranged via an air gap over the one of the plurality of gate finger electrodes.

2. A semiconductor device, comprising:
    a substrate;
    a gate electrode, which is arranged on a first surface of the substrate and has a plurality of gate finger electrodes;
    a source electrode, which is arranged on the first surface of the substrate and has a plurality of source finger electrodes, and one of the plurality of source finger electrodes is close to one of the plurality of gate finger electrodes;
    a drain electrode, which is arranged on the first surface of the substrate and has a plurality of drain finger electrodes, and one of the plurality of drain finger electrodes faces the one of the plurality of source finger electrodes via the one of the plurality of gate finger electrodes;
    a gate terminal electrode, which is arranged on the first surface of the substrate and is connected to the gate electrode;
    a source terminal electrode, which is arranged on the first surface of the substrate and is connected to the source electrode;
    a drain terminal electrode, which is arranged on the first surface of the substrate and is connected to the drain electrode;
    an insulating layer, which is arranged so as to cover the one of the plurality of gate finger electrodes, the substrate between the one of the plurality of gate finger electrodes and the one of the plurality of source finger electrodes, the substrate between the one of the plurality of gate finger electrodes and the one of the plurality of drain finger electrodes, at least a part of the one of the plurality of source finger electrodes, and at least a part of the one of the plurality of drain finger electrodes;
    a shield plate electrode, which is arranged via the insulating layer over the one of the plurality of drain finger electrodes and the first surface of the substrate between the one of the plurality of gate finger electrodes and the one of the plurality of drain finger electrodes, is short-circuited to the one of the plurality of source finger electrodes, and shields electrically the one of the plurality of gate finger electrodes and the one of the plurality of drain finger electrodes from each other; and a first line, which connects the shield plate electrode and the source terminal electrode by an air-bridge structure or an overlay structure, wherein the first line connects the shield plate electrode and the source terminal electrode by the air bridge structure.

3. A semiconductor device, comprising:

a substrate;

a gate electrode which, is arranged on a first surface of the substrate and has a plurality of gate finger electrodes;

a source electrode, which is arranged on the first surface of the substrate and has a plurality of source finger electrodes, and one of the plurality of source finger electrodes is close to one of the plurality of gate finger electrodes;

a drain electrode, which is arranged on the first surface of the substrate and has a plurality of drain finger electrodes, and one of the plurality of drain finger electrodes faces the one of the plurality of source finger electrodes via the one of the plurality of gate finger electrodes;

a gate terminal electrode, which is arranged on the first surface of the substrate and is connected to the gate electrode;

a source terminal electrode, which is arranged on the first surface of the substrate and is connected to the source electrode;

a drain terminal electrode, which is arranged on the first surface of the substrate and is connected to the drain electrode;

an insulating layer, which is arranged so as to cover the one of the plurality of gate finger electrodes, the substrate between the one of the plurality of gate finger electrodes and the one of the plurality of source finger electrodes, the substrate between the one of the plurality of gate finger electrodes and the one of the plurality of drain finger electrodes, at least a part of the one of the plurality of source finger electrodes, and at least a part of the one of the plurality of drain finger electrodes;

a shield plate electrode, which is arranged via the insulating layer over the one of the plurality of drain finger electrodes and the first surface of the substrate between the one of the plurality of gate finger electrodes and the one of the plurality of drain finger electrodes, is short-circuited to the one of the plurality of source finger electrodes, and shields electrically the one of the plurality of gate finger electrodes and the one of the plurality of drain finger electrodes from each other;

a first line, which connects the shield plate electrode and the source terminal electrode by an air-bridge structure or an overlay structure; and a second line, which connects the plurality of source finger electrodes and the source terminal electrode, wherein a second line connects the plurality of source finger electrodes and the source terminal electrode by the air-bridge structure.

* * * * *